United States Patent [19]

Jackson

[11] Patent Number: 5,081,167
[45] Date of Patent: Jan. 14, 1992

[54] CYANAMIDE-CURED MALEIMIDE/EPOXY RESIN BLEND

[75] Inventor: Roy J. Jackson, Houston, Tex.

[73] Assignee: Shell Oil Company, Houston, Tex.

[21] Appl. No.: 553,045

[22] Filed: Jul. 16, 1990

[51] Int. Cl.⁵ .................. C08K 3/22; C08K 3/40
[52] U.S. Cl. ...................... 523/444; 528/94; 528/102; 528/117; 525/423
[58] Field of Search ............ 528/94, 102, 117; 523/444; 525/423

[56] References Cited

U.S. PATENT DOCUMENTS

| | | | |
|---|---|---|---|
| 3,637,901 | 1/1972 | Bargain et al. | 260/830 P |
| 3,839,493 | 10/1974 | Balme et al. | 260/830 P |
| 4,043,986 | 8/1977 | Gruffaz et al. | 260/78 |
| 4,130,600 | 12/1978 | Zahir et al. | 260/830 P |
| 4,291,146 | 9/1981 | Haug | 528/119 |
| 4,424,336 | 1/1984 | Haug | 528/117 |
| 4,427,803 | 1/1984 | Moulton et al. | 528/117 |
| 4,482,703 | 11/1984 | Takahashi et al. | 528/322 |
| 4,546,168 | 10/1985 | Takahashi et al. | 528/107 |
| 4,816,531 | 3/1989 | Young | 525/488 |
| 4,876,325 | 10/1989 | Olson et al. | 528/170 |
| 4,912,190 | 3/1990 | Schäfer | 528/94 |

FOREIGN PATENT DOCUMENTS

| | | |
|---|---|---|
| 3714997 | 11/1988 | Fed. Rep. of Germany . |
| 1349709 | 4/1974 | United Kingdom . |
| 1539558 | 1/1979 | United Kingdom . |

*Primary Examiner*—Paul R. Mich
*Assistant Examiner*—Christopher P. Rogers

[57] ABSTRACT

A polymaleimide/epoxy blend is cured with cyanamide to provide interlocked one-phase networks with superior thermal properties.

9 Claims, No Drawings

CYANAMIDE-CURED MALEIMIDE/EPOXY RESIN BLEND

BACKGROUND OF THE INVENTION

This invnetion relates to maleimide/epoxy resin blends. In a specific aspect, the invention relates to the preparation of polymaleimide/epoxy resin blends having good high-temperature properties.

Maleimide resins are thermosettable materials useful in high-temperature electrical and structural applications. Cured bismaleimide resins have good properties for high-temperature applications. However, bismaleimides are expensive relative to other resins such as epoxy resins, and have been found difficult to process in electrical and composities applications. Therefore, bismaleimide resins have been blended with epoxy resins to improve processing characteristics and to lower costs.

It is known that careful selectin of the curing agent added to bismaleimide/epoxy blends is necessary, as the nature of the curing agent will have an effect on the properties of both the uncured and cured blends. For example, it is important in preparing electrical laminates for circuit boards to use a resin formulation which can be partially-cured to form a stable prepreg which does not further cure or gel prior to fabrication of the prepreg into a laminate, but which cures rapidly once the laminate is exposed to cure temperatures. Furthermore, it is important that the cured blend exhibit good high-temperature properties, including a high glass transition temperature, which is dependent to some extent on the maleimide/epoxy blend curing.

It is therefore an object of the invention to provide maleimide/epoxy compositions having suitable thermal properties and process stability for electrical and structural applications.

BRIEF SUMMARY OF THE INVENTION

According to the invention, there is provided a curable thermosettable composition comprising (a) a polymaleimide resin (b) an epoxy resin and (c) cyanamide. The invention composition provides for stable polymaleimide/epoxy blends which cure rapidly and, in the cured state, have good thermal properties.

DETAILED DESCRIPTION OF THE INVENTION

The polymaleimide resins suitable for the invention composition include bis- and higher-maleimide resins such as tris- and tetra-maleimide resins.

The preferred polymaleimide resins for the invention composition are N,N'-unsaturated bismaleimides which can be represented by the formula

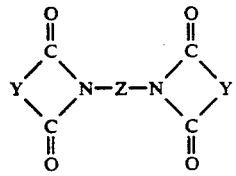

in which Y is a substituted or unsubstituted divalent radical having at least 2 carbon atoms, preferably 2 to 6 carbon atoms, and a carbon-carbon double bond, and Z is a divalent radical containing from about 2 to about 40 carbon atoms. Z can be aliphatic, cycloaliphatic, aromatic or heterocyclic. Z can include heteroatoms and can be substituted or unsubstituted. Examples of bismaleimides which can be employed are N,N'-bismaleimides of ethylene diamine, hexamethylene diamine, trimethylhexamethylene diamine, phenylene diamine, trimethylhexamethylene diamine, methylene dianiline, toluene diamine, 4,4'-diphenylmethane diamine, 3,3'-diphenylsulfone diamine, 4,4'-diphenylether diamine, 4,4'-dicyclohexanemethane diamine, metaxylylene diamine, and 4,4'-diphenylcyclohexane diamine. Various N,N'-bismaleimides are disclosed in U.S. Pat. Nos. 3,562,223, 4,211,860, 4,211,861 and 4,816,531, for example, and can be prepared by methods known in the art. The N,N'-unsaturated bismaleimides are preferably derived from at least one aromatic diamine. The preferred bismaleimide is N,N'-4,4'-diphenylmethane bismaleimide. The bismaleimide can contain various additives as processing aids. Suitable N,N'-unsaturated bismaleimides are available commercially from Shell Chemical Co. as Compimide ® resins, for example.

Other suitable polymaleimide resins include compounds which can be represented by the formula

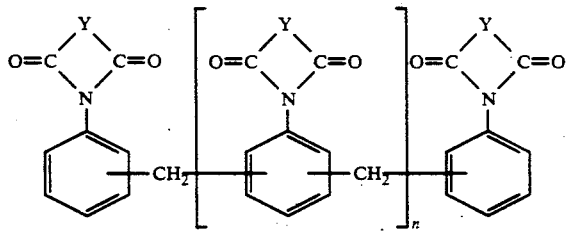

in which Y is a substituted or unsubstituted divalent radical having at least 2 carbon atoms, preferably 2 to 6 carbon atoms, and a carbon-carbon double bond. Such polymaleimides are disclosed in U.S. Pat. No. 4,298,720, for example. Specific examples of such compounds include polymethylene polyphenylene polymaleimides having the formula

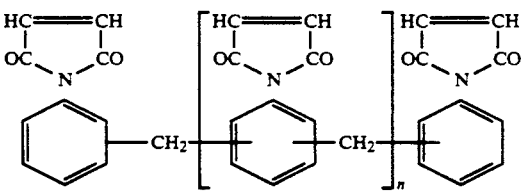

in which n is a number having an average value of 0 or greater, preferably an average value from about 0 to about 4. These polymaleimides can be obtained by reacting an anilineformaldehyde condensation product with maleic anhydride as described in the above patent.

Generally, the epoxy resin for the invention composition can be any curable epoxy resin having a 1,2-epoxy equivalency greater than one and preferably, on the average, more than about 1.5 epoxide group per molecule. The epoxy resin can be saturated or unsaturated, linear or branched, aliphatic, cycloaliphatic, aromatic or heterocyclic, and may bear substituents which do not materially interfere with the curing reaction. Such substituents can include bromine. They may be monomeric or polymeric, liquid or solid, but are preferably liquid at room temperature. Suitable epoxy resins include glycidyl ethers prepared by reacting epichlorohydrin with a compound containing at least one hydroxyl group carried out under alkaline reaction conditions. Examples of epoxy resins suitable for use in the invention include polyglycidyl ethers of polyhydric compounds, epoxy novolacs or similar polyhydroxyphenol resins, polyglycidyl ethers of glycols or polyglycols, and polyglycidyl esters of polycarboxylic acids.

The preferred epoxy resins for electrical applications are brominated epoxy resins. Suitable brominated epoxy resins include the fusion products of reacting a diglycidyl ether of 2,2-bis(4-hydroxyphenyl)-propane (bisphenol-A) with tetrabromo bisphenol-A. The brominated epoxy resins preferably have an average weight per epoxide (WPE) greater than 350, preferably greater than 400 and number average molecular weight greater than about 700, preferably greater than about 800, and an epoxide functionality greater than about 1.5, preferably in the range of about 1.8 to about 2. A commercial example of such resins include EPON ® Resin 1123, a brominated diglycidyl ether of bisphenol-A having a number average molecular weight of about 850.

The amount of epoxy resin in the blend can vary depending on the desired properties. Generally, the relative amounts of the polymaleimide resin to the epoxy resin will be within the weight ratios from about 50:50 to about 90:10, preferably from about 70:30 to about 80:20.

The amount of cyanamide curing agent can vary depending on the process conditions, such as reactivity of the resin formulation, gel time, reaction temperature and properties of the resin components. Generally, cyanamide will be present in an amount effective to cure the resin components at a gel time of greater than about 100 seconds at about 160° C. If the gel time of the resin formulation is too short, a prepreg prepared with the formulation will not flow in a press, forming a "dead prepreg." The cyanamide curing agent is preferably present in an amount within the range from about 0.1 to about 15 weight percent, most preferably from about 0.3 to about 5 weight percent, based on the total resin components and cyanamide.

The curing agent optionally can contain a cure accelerator in order to promote faster and/or lower temperature cure of the resin components. Suitable accelerators include, for example, tertiary amines, imidazoles, phosphenes, octoates and boron trifluorides for example. Because of their availability and performance characteristics, imidazoles such as 2-methyl imidazole, 2-methyl-4-ethyl imidazole, and isopropyl imidazole, are preferred. The accelerator can be present in the composition in an amount effective to increase the cure rate and/or lower the cure temperature of the compositions, generally in an amount from 0 to about 5 weight percent, based on the weight of the epoxy, bismaleimide and curing agent components of the composition. If present, an amount of accelerator within the range of about 0.01 to about 2 weight percent is preferred.

In addition to cyanamide, for flame-proof applications, the curing agent can optionally contain a brominated phenolic curing agent such as brominated bisphenol-A. The brominated bisphenol-A will be present in an amount up to about 40 weight percent, usually up to about 15 weight percent, based on the combined weight of epoxy resin and curing agent.

The invention composition can optionally, for applications involving application to a fibrous substrate, or prepregging, include an organic solvent or diluent present in an amount effective to decrease the viscosity of the system for easier processing. Polar organic solvents such as ketones, alcohols and glycol ethers, for example, are suitable. The preferred solvents for the resin components are ketones such as acetone, methyl ethyl ketone and methyl isobutyl ketone. Suitable glycol ethers include methyl oxitol, propylene glycol and ethylene glycol monomethyl ether, for example. Methyl ethyl ketone is the preferred solvent for the resin composition because it can be removed readily. The proportion of solid components in the composition will vary widely depending upon the amount of the other constituents present and the intended application of the composition, but for prepregging applications the solvent will generally constitute at least about 15 weight percent of the total weight of the resin solution. Preferably, the solvent will be present in the resin solution in an amount from about 15 to about 60, most preferably about 30 to about 50 weight percent. The epoxy resin and polymaleimide resin can be stirred into the selected solvent at ambient temperature to form the epoxy/polymaleimide solution.

Because of the different solubility characteristics of some of the bismaleimide resins and the epoxy resin, a separate solvent for each resin can be used to mix the resins in solution. For prepregging applications, when a bismaleimide resin having low solubility in ketones is used, N,N-dimethyl formamide or blends of other organic solvents, such as isopropyl alcohol or N-methyl pyrrolidone, for example, with dimethyl formamide can be used. The solution can be formed by stirring the bismaleimide resin into the selected solvent with optional mild heating not greater than about 40° C., then mixed with a solution of the epoxy resin.

The resin solution and cyanamide curing agent are blended, with an optional accelerator, at ambient temperature to produce the "varnish" or prepregging composition. The invention composition is generally stable in the varnish solution for 8 hours or more, with the resin staying in solution without advancement and the resulting premature gelation.

For preparation of reinforced laminates from the varnish, a substrate of glass, carbon, quartz, Kevlar, polyester or like material, in chopped, mat or woven form is first impregnated with the varnish. A prepreg is formed by heating the impregnated substrate in a treater at a temperature sufficient to remove the solvent and to "B-stage," or partially cure the resin without gelation. In a commercial treater, the resin is preferably heated at a temperature within the range of about 160° C. to about 195° C., for time effective to remove the solvent and to advance the resin to the B-stage. Then, in a press, the resin is preferably heated to a temperature within the range of about 160° C. to about 200° C., more preferably about 160° C. to about 180° C., for a time effective to cure the resins and to consolidate the prepregs into a laminate. If the resin system gels, the prepreg will not flow to form a laminate. The laminate can optionally include one or more layers of a conductive material such as copper. Laminating conditions generally include a time of about 1 to about 2 hours. The composition can optionally include constituents such as inorganic fillers and additional flame retardants, for example. The laminates optionally can be "post-cured" by heating at a temperature within the range of about 200° C. to about 235° C. for time effective to improve thermal properties, typically for about 1 to about 8 hours.

Laminates cured with cyanamide provide interlocked networks of an epoxy resin and a polymaleimide resin with superior thermal properties. Many of the process steps in manufacturing a printed circuit board require temperatures in excess of about 280° C. In order for the maleimide/epoxy blends to survive such processes and to perform like maleimides, the blends must not exibit any drop in the modulus due to the epoxy resin component. Some commercial imide/epoxy blends show, in the shape of the dynamic mechanical analyzer (DMA) cure curve, both a damping maximum at higher temperature (above about 300° C.) and a shoulder or a peak at lower temperature, indicating a drop in the modulus at the lower temperature due to the epoxy resin component. As shown in the examples below, cyanamide cures a maleimide/epoxy blend to an interlocked one-phase network structure which exhibits good high-temperature properties. In addition, the invention curable resin composition provides long-term stability with fast cure upon application of heat.

In addition to printed circuit boards and other high-performance electrical laminates applications, the invention composition is useful for electrical component encapsulation, molding powders, coatings and structural composites parts fabrication.

EXAMPLE 1

This example demonstrates preparation of a bismaleimide/epoxy composition cured with cyanamide according to the invention.

A varnish solution was prepared by placing a bismaleimide resin (COMPIMIDE ® 1206 available from Shell Chemical Co.), a novolac epoxy resin (a bisphenol-A novolac epoxy resin having a number average molecular weight greater than about 500), cyanamide and the solvent listed in Table 1 in a 500 ml beaker and stirring until the components were dissolved.

Prepregs were prepared from the varnish solution by coating the solution on a 7628 woven glass cloth. The coated resin was advanced to a "B" stage in a forced air oven at 163° C. for 3.25 minutes. Then eight layers of prepregs were stacked and pressed into a laminate at 180° C. for one hour. The laminate was postbaked at 220° C. for four hours to complete the cure. Properties of the bismaleimide/epoxy laminate are shown in Table 1 below.

EXAMPLE 2

This example demonstrates preparation of a bismaleimide/epoxy blend cured with a phenolic curing agent.

An epoxy/phenolic solution, was prepared by mixing 35.3 weight percent of epoxidized bisphenol-A novolac (Epon ® DX-90, a bisphenol-A novolac epoxy resin having a number average molecular weight greater than about 500 from Shell Chemical Company) with 13.4 weight percent of bisphenol-A novolac (a phenolic curing agent, Epikure DX-175 from Shell Chemical Company) and 11.3 weight percent of tetrabromobisphenol-A with 40 weight percent of methyl ethyl ketone until dissolved.

A varnish solution was prepared by placing a bismaleimide resin (COMPIMIDE ® 1206 available from Shell Chemical Co.), the epoxy/phenolic solution and an accelerator listed in Table 1 in a 500 ml beaker and stirring until the components were dissolved.

Prepregs were prepared from the varnish solution in a similar manner to Example 1. Properties of the bismaleimide/epoxy laminate are shown in Table 1 below.

EXAMPLE 3

This example demonstrates preparation of another bismaleimide/epoxy composition cured with cyanamide according to the invention.

A varnish solution was prepared by placing a bismaleimide resin (COMPIMIDE ® 1206 available from Shell Chemical Co.), a brominated epoxy resin (EPON ® Resin 1123-A-80, a reaction product of tetrabromobisphenol-A and that diglycidyl ether of bisphenol-A, available from Shell Chemical Company), cyanamide and the solvent listed in Table 1 in a 500 ml beaker and stirring until the components were dissolved.

Prepregs were prepared from the varnish solution by coating the solution on a 7628 glass cloth. The coated resin was advanced to a "B" stage in a forced air oven at 163° C. for 3.5 minutes. Then eight layers of prepregs were stacked and pressed into a laminate for one hour at a temperature of 180° C. and a pressure of 50 psi. The laminate was postbaked at 220° C. for 6 hours to complete the cure. Properties of the bismaleimide/epoxy laminate are shown in Table 1 below.

EXAMPLE 4

For comparison, this example demonstrates preparation of a bismaleimide/epoxy composition cured with a dicyandiamide curing agent.

A varnish solution was prepared by placing a bismaleimide resin (COMPIMIDE ® 1206), a brominated epoxy resin, dicyandiamide and the solvent listed in Table 1 in a 500 ml beaker and stirring until the components were dissolved.

Prepregs were prepared from the varnish solution in a similar manner to Example 3. Properties of the bismaleimide/epoxy laminate are shown in Table 1 below.

TABLE 1

| | 1 | 2 | 3 | 4 |
|---|---|---|---|---|
| Composition (grams) | | | | |
| COMPIMIDE ® 1206-R-60* | 66.67 | 116.7 | 35 | 35 |
| EPON ® Resin 1123-A-80 | — | — | 15 | 15 |
| Cyanamide | 2.75 | — | 1.11 | — |
| Novolac epoxy resin** | 12.5 | — | — | — |
| Epoxy/Phenolic Solution** | — | 50 | — | — |
| Dicyandiamide | — | — | — | 1.11 |
| 2-methyl imidazole | — | 0.1 | — | — |
| Methyl oxitol | — | — | 5 | 5 |
| Properties | | | | |
| Gel time, @ 171° C. | 138 sec | 167 sec | 157 sec | 158 sec |
| Prepreg time, @ 163° C. | 3¼ min | 3 min | 3.5 min | 3.5 min |
| Laminate Properties | | | | |
| Glass Transition Temp. @ °C. | | | | |
| max in damping | 319 | >350 | 340 | 320 |
| shoulder | | 237 | | |
| 5% weight loss, °C. | 386 | 360 | 392 | 365 |
| Coefficient of | 67[1] | 97 | 22 | 35 |
| thermal expansion | 49[2] | | | |

*60% solution in dimethyl formamide.
**80% solution in methyl ethyl ketone
[1]First heat up to 300° C. Expansion taken from 50-250° C.
[2]Second heat up. Expansion taken from 50-250° C.

The laminates prepared from the invention composition (Example 1 and Example 3) have excellent high-temperature properties, including a high glass transition temperature maximum without any shoulder on the DMA curve. There is no indication of any drop in the modulus due to the epoxy resin component. They also have low coefficients of thermal expansion and good heat resistance, evidenced by the relatively high temperature required for 5 percent weight loss. These results suggest that the invention composition is suitable for use in high-temperature processes and applications.

I claim:

1. A curable composition comprising:
   (a) a polymaleimide resin;
   (b) an epoxy resin present in the composition such that the weight ratio of (a) to (b) is from about 90:10 to about 50:50; and
   (c) an effective amount of cyanamide to cure the polymaleimide resin and the epoxy resin.

2. The composition of claim 1 further comprising (d) a cure accelerator.

3. The composition of claim 1 in which cyanamide is present in an amount of about 15 to about 0.1 weight percent, based on the weight of components (a), (b) and (c).

4. The composition of claim 1 in which the polymaleimide resin is a N,N'-unsaturated bismaleimide which can be represented by the formula

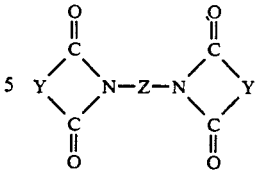

in which Y is a substituted or unsubstituted divalent radical having at least 2 carbon atoms and a carbon-carbon double bond, and Z is a divalent radical comprising from about 2 to about 40 carbon atoms.

5. The composition of claim 1 in which the epoxy resin has an average of at least about 1.5 epoxide groups per molecule.

6. The composition of claim 5 in which the epoxy resin is a brominated epoxy resin.

7. An article of manufacture comprising a cured composition according to claim 1.

8. The composition of claim 1 further comprising glass fibers.

9. An electrical laminate comprising the composition of claim 8.

* * * * *